INVENTORS
NATHAN PRITIKIN,
BERNARD FELDMAN,
ANDRES ROMERO
BY THEIR ATTORNEYS
HARRIS, KIECH, RUSSELL & KERN

CIRCUIT MODULE
Filed March 2, 1964 2 Sheets-Sheet 2
FIG. 4.
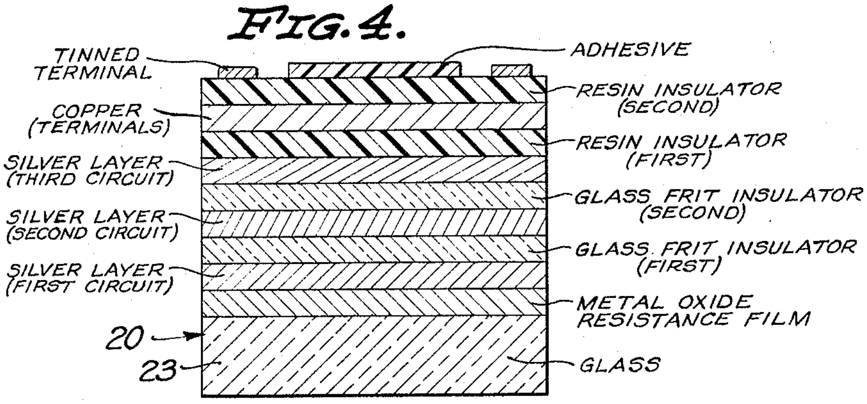
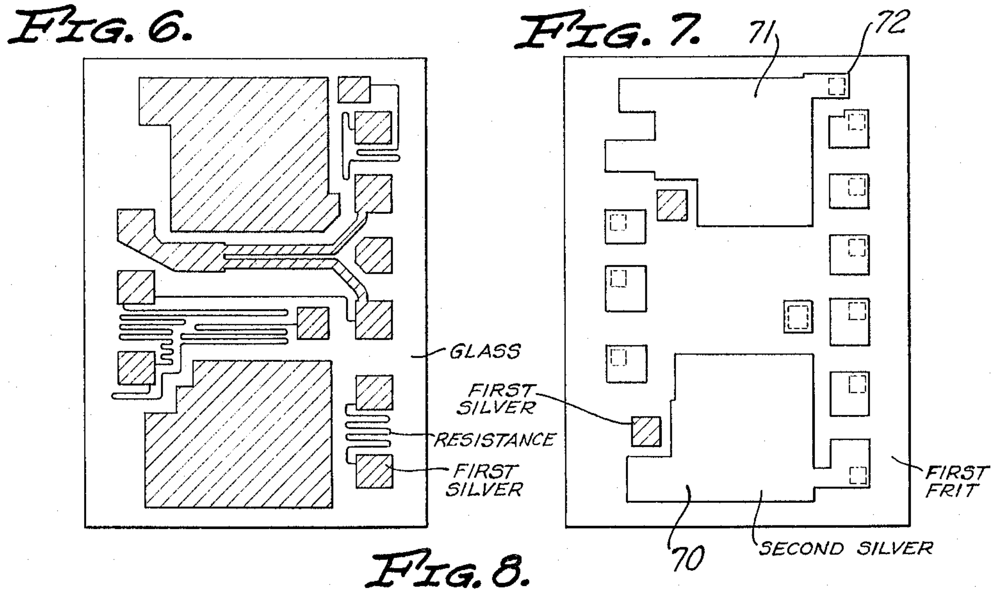
FIG. 6. FIG. 7. FIG. 8.
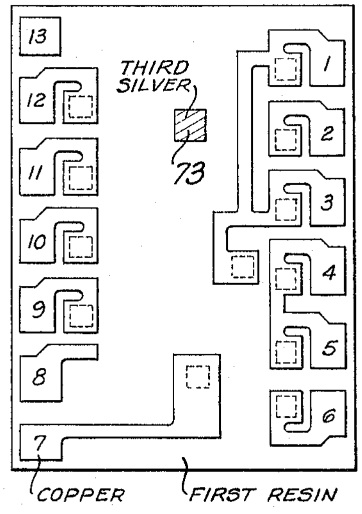
FIG. 2.
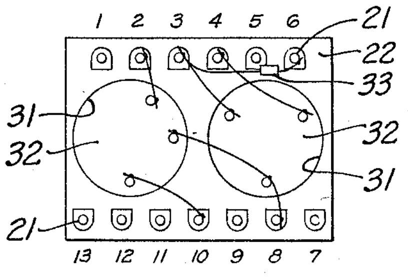
INVENTORS
NATHAN PRITIKIN,
BERNARD FELDMAN,
ANDRES ROMERO
BY THEIR ATTORNEYS
HARRIS, KIECH, RUSSELL & KERN 3,289,045
Patented Nov. 29, 1966

3,289,045

CIRCUIT MODULE

Nathan Pritikin, Santa Barbara, Bernard Feldman, Ventura, and Andres Romero, Santa Barbara, Calif., assignors to Intellux Inc., Santa Barbara, Calif., a corporation of California Filed Mar. 2, 1964, Ser. No. 348,543
11 Claims. (Cl. 317—101)

This invention relates to circuit modules, particularly to modules utilizing thin film circuitry and where desired, additional active and/or passive elements, to produce standard modular components for utilization in forming electronic systems of any type. It is an object of the invention to provide such modules which are small, rugged, and not affected by extremes of temperature, humidity, shock and the like. Another object is to provide such circuit modules which can be designed and manufactured to provide standard circuit units suitable for mass production and stocking to provide an off-the-shelf supply of modular components for use by system designers.

It is an object of the invention to provide a circuit module including a circuit carrying chip having a plurality of terminals on one face thereof, a plurality of leads with one end of each lead connected to a corresponding terminal, and an insulating housing overlying and fixed to the face of the chip and enclosing and fixed to the leads adjacent the terminal ends thereof. A further object is to provide such a module in which additional circuit elements, active or passive, including transistors and diodes may be carried in or on the housing and directly connected to the leads of the module.

It is an object of the invention to provide such a circuit module in which the housing may be formed as a separate element for mounting on the chip or in which the housing may be molded in place on the chip and leads. A particular object is to provide such a circuit module in which the leads are fixed and mechanically supported in the insulating housing so as to eliminate mechanical stresses in the film circuitry normally occuring with lead manipulation.

It is an object of the invention to provide a new and unique lead design and mode of insulation for use in circuit modules. A further object is to provide an electrical circuit unit for use in a circuit module or the like and including film conductors for electrically interconnecting the film circuitry with leads, with the film conductors being flexible to isolate mechanical stresses in the leads from the film circuitry. Another object is to provide a new and improved film circuit suitable for use in circuit modules and the like.

The invention also comprises novel details of construction and novel combinations and arrangements of parts, which will more fully appear in the course of the following description. The drawings merely show and the description merely describes preferred embodiments of the present invention which are given by way of illustration or example.

In the drawings:

FIG. 2 is a top view of the module of FIG. 1;

FIG. 4 is a diagram illustrating the film layers comprising the circuit carrying chip;

FIGS. 6, 7 and 8 are plan views of the circuit carrying chip illustrating various layers thereof;

Figure 1:
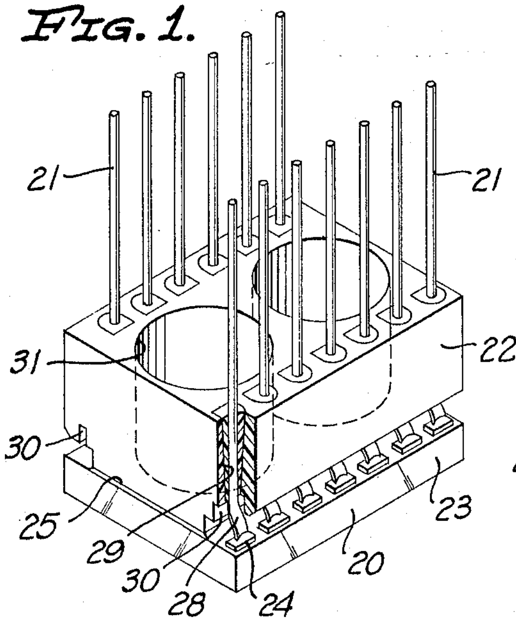
FIG. 1 is an isometric view of a preferred embodiment of the circuit module of the invention.
Figure 3:
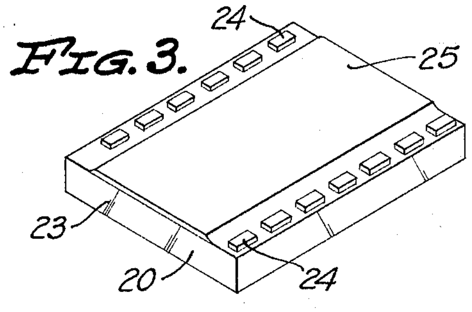
FIG. 3 is an isometric view of the circuit carrying chip of the module of FIG. 1.

The circuit module of FIG. 1 includes a circuit carrying chip 20, thirteen leads 21, and an insulating housing 22. The chip 20 is shown in FIG. 3 and typically may comprise a glass substrate 23 with one or more layers of circuitry thereon. A preferred form of chip will be described in detail hereinbelow. A plurality of terminals 24 is provided in two rows along opposing edges of the chip for connection to corresponding leads 21. The individual terminals 24 are tinned for soldering and the tinning layer is shown in exaggerated thickness in FIG. 3. A layer 25 of an adhesive, such as an epoxy resin, is applied to the central portion of the chip face between the rows of terminals 24 to provide for adhering the chip to the housing 22. The circuitry on the chip may range from a simple resistor to complex multilayer networks and the module may incorporate any number of leads from two up. Applicants have prepared a line of circuit modules for digital systems all incorporating the structure of the embodiment described herein and have standardized on the thirteen-lead package. Connections may be made to the leads 21 by soldering or welding and the modules may be mounted on printed circuit boards having openings for receiving the leads to provide both mechanical and electrical connections between the board and the module.

The preferred form of lead illustrated in FIG. 1 is a cylindrical wire having a flattened or spade-shaped end 28 which is tinned for soldering to a corresponding terminal 24. The cylindrical portion of the lead preferably is a sliding fit in a passage 29 of the housing 22, with the flattened end 28 resting in a groove 30 for controlling the position and orientation of the lead in the housing prior to the soldering operation.

The module of FIG. 1 may be assembled as follows: The leads 21 are positioned in the passages 29 of the housing 22. The housing is then positioned over the chip, the housing and chip are compressed together, and the leads are compressed against the terminals of the chip, as by a downward force on the upper ends of the leads. The structure is now heated, as by means of an induction coil positioned around the module, to effect soldering of the tinned leads to the tinned terminals and bonding of the chip to the housing by the adhesive layer. The module is now ready for the insertion of additional circuit elements such as transistors, diodes and the like. Two cavities 31 are provided in the housing 22 for receiving transistors 32 which may be positioned therein with the terminal end facing out. The transistor terminals are connected to appropriate leads as by spot welding, as best seen in FIG. 2. When desired, a diode 33 may be connected in circuit in the same manner.

The leads are mechanically bonded to the housing 22 as by filling the passages 29 with an epoxy resin so as to eliminate any mechanical stresses on the connection between the lead ends and the chip terminals. The fully assembled module may be dip coated in an insulating material such as polyurethane to provide leakage protection.

Figure 5:
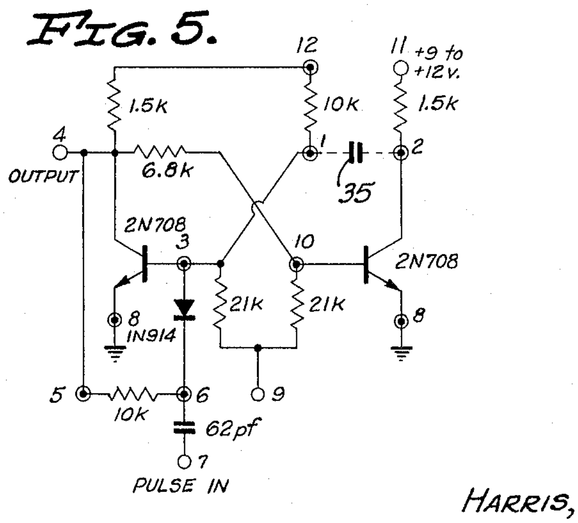
FIG. 5 is a schematic illustrating one circuit for use in the module of FIG. 1.

A schematic of a specific circuit which can be provided in the module of FIG. 1 is shown in FIG. 5. This circuit is a one shot multivibrator. The terminals identified by numerals 1 through 12 correspond to the leads 1 through 12 of FIG. 2, the lead 13 not being used. The two transistors of the circuit are carried in the cavities of the housing and the diode is carried on top of the housing, as shown in FIG. 2. The resistors, the 62 picofarad capacitor and the circuit interconnections are provided in the circuit carrying chip 20. The capacitor 35 of the schematic is intended to be connected into the circuit externally of the module. The value of this external capacitor 35 controls the delay of the one shot multivibrator. In the particular circuit illustrated, a 20 picofarad capacitor provides approximately 200 nanoseconds, 2,000 picofarads provides approximately 20 microseconds, and 2 microfarads provides approximately 20 milliseconds delay. By utilization of the external capacitor for timing control, the one shot multivibrator module can be built as a stock item and can be provided off the shelf for use in systems to provide a wide range of delays. For the typical circuits which utilize the module construction are continuous multivibrators, double *nor* gates, *nor* gate and buffer combinations, flip-flops, and the like.

A typical module may utilize a chip in the order of ⅜ inch by ½ inch by .065 inch, a housing in the order of ⅜ inch by ½ inch by ¼ inch, and gold plated dumet leads .020 inch diameter. In another module utilizing smaller transistors, the housing is made in the order of $\frac{3}{32}$ inch thick. In another alternative structure, unpackaged transistors may be utilized and the cavities in the housing may be omitted, with the transistors applied directly on the chip between the terminals or on the surface of the housing between the leads.

In another alternative form of construction, the leads and any externally connected circuit elements such as transistors or diodes may be connected to the chip after which the housing is molded in place over the chip and around the leads, thus providing the desired mechanical support for the leads and eliminating stress on the lead-chip interconnection.

Figure 9:
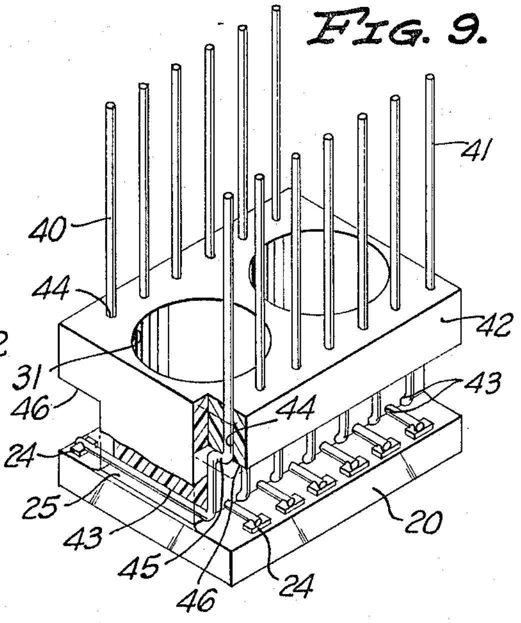
FIG. 9 is an isometric view of an alternative embodiment of the circuit module.

An alternative embodiment of the circuit module is shown in FIG. 9. One group of substantially L- shaped leads 40 is positioned on the chip 20 with the leads disposed parallel to each other and with the ends of the leads soldered to corresponding terminals 24 along one edge of the chip 20. Another group of similar leads 41 is positioned on the chip interspersed between the leads of the first group and connected to corresponding terminals along the opposite edge of the chip. A housing 42 is provided with a plurality of grooves 43 for receiving the leads 40, 41 and is fixed to the upper surface of the chip 20, as by means previously described. The leads 40, 41 may pass through appropriate passages 44 provided in the housing 42 and each lead preferably has an offset section 45 engaging a shoulder 46 of the housing for carrying stresses on the external ends of the leads.

Additional circuit elements may be mounted in or on the housing, the leads may be potted in place, and the entire module may be dipped, as described in conjunction with the module of FIG. 1. While the embodiments disclosed herein show all of the leads projecting perpendicularly away from the circuit carrying chip, the leads may have other orientations and may be directed away from the chip in the plane of the chip when desired.

Figure 10:
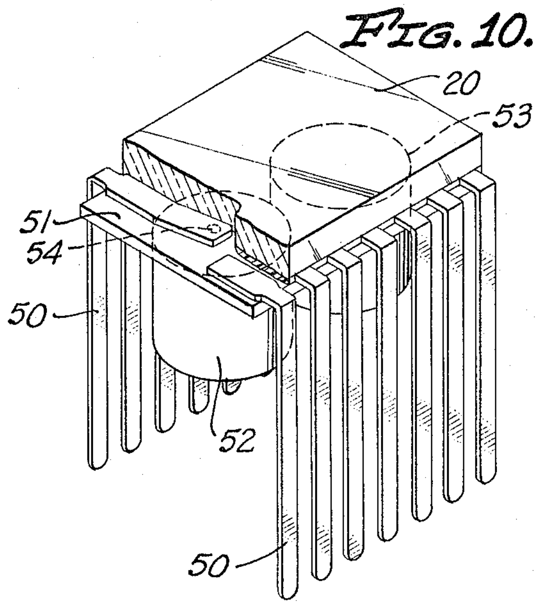
FIG. 10 is an isometric view of another alternative embodiment of the circuit module of the invention.

In the embodiment of FIG. 10, the leads 50 may be adhered to a housing 51 and transistors 52, 53 may be carried on the housing with their terminals 54 projecting therethrough for connection to corresponding leads. The housing carrying the leads and other circuit elements may then be fixed onto the terminal face of the chip 20 as previously described to provide the complete module. This embodiment of the invention is particularly adapted for use with uncased transistors which can be mounted directly on the face of the housing 51 carrying the leads 51. The structure is then covered with an insulating layer which leaves portions of the leads exposed for connection to the terminals of the chip.

The circuit carrying chip 20 may be a highly stable component having multilayer thin film circuits thereon and hermetically sealed with fused glass superstrates so as to be substantially unaffected by extremes of temperatures, rates of temperature change, thermal and mechanical shock and aging. A preferred form of chip is illustrated in FIGS. 3–8.

An enlarged sectional view of the chip is shown in FIG. 4 to illustrate the multilayer construction. The various resistance, conducting and insulating layers may be formed of conventional materials and applied using conventional techniques which will not be described in detail herein. An iridized metal oxide film is applied to the glass substrate in the pattern shown in FIG. 6 to provide the various resistors of the circuit and to provide larger areas for interconnecting the resistors and to serve as terminals and capacitor plates. A silver film may then be applied over the terminal, conductor and capacitor portions of the oxide film, as indicated by the section lines of FIG. 6, for the purpose of increasing the conductivity of these portions of the circuit.

An insulating layer, preferably in the form of a fired glass frit, is applied next, with openings therein at zones where interconnections are to be made with overlying circuits.

Referring to FIG. 7, these openings in the first frit insulating layer are indicated by the dashed line rectangles under the second silver circuit and by the two section lined rectangles of the first silver circuit not covered by the second silver circuit. Another silver layer comprising the second circuit is now applied in the pattern shown in FIG. 7 to serve as the intermediate capacitor plates, to connect these capacitor plates to appropriate terminals, and to carry terminals through from the first circuit to the third circuit. The specific one shot multivibrator circuit illustrated herein requires only one capacitor, which is formed with the lower plates indicated at 70. The upper capacitor plate 71 of the second circuit serves as as conductor connection between terminal 12 and the 10K ohm resistor connected to terminal 1.

A second glass frit insulating layer is next applied over the ship with this layer merely covering the capacitor plates 70, 71 while leaving the terminals 6 and 12 exposed. This frit insulating layer serves as a capacitor dielectric in the same manner as the first frit insulating layer. Next the third silver circuit is applied which circuit has the pattern of the second silver circuit except that the third silver circuit also overlies those portions of the first silver circuit exposed as shown in FIG. 7 for interconnecting the top and bottom capacitor plates. The third silver circuit also does not connect the plate 70 with terminal 6 nor the plate 71 with trminal 12 nor the plate 71 with the terminal area 72.

Another insulating layer is now applied over the third silver layer, this insulating layer having openings therein as indicated by the dashed line rectangles and the section lined rectangle of FIG. 8. This insulating layer may also be a fired glass frit but preferably is a less expensive resin layer as the circuit elements themselves have been adequately protected by the underlying glass frit layers.

Another conducting layer is now applied in the pattern of FIG. 8 to provide interconnections between various circuit points and to provide pads for affixing the leads. Typically, this layer may comprise a copper film applied by electroplating over the resin insulating layer and affixed to the third silver circuit through the openings in the insulating layer. The desired pattern in the copper film may then be produced by conventional photoetching. In the specific embodiment illustrated no copper film connection is made at the zone 73 because the upper capacitor is not utilized in the circuit. Another insulating layer is applied over the copper circuit with openings only at the thirteen terminals identified by the numbers 1–13. The exposed copper terminals are then tinned and the strip of adhesive 25 is applied between the two rows of terminals to produce the completed chip of FIG. 3.

The construction and configuration of the uppermost circuit which forms the terminals 1–13 are particularly significant. The copper conductors are rigidly joined to the third silver circuit through the openings in the insulating layer but the copper conductors are not adhered to the insulating layer itself. The leads 21 of the module are fixed to corresponding copper conductors at the terminal zones identified by the numbers 1–13, which terminal zones are spaced from the portions of the copper conductors affixed to the underlying silver circuit. Motion produced in the terminal area of a copper conductor by the lead connected thereto as a result of mechanical or thermal change or any other cause is absorbed by the flexibility of the copper conductor and is not transferred to the junction between the copper conductor and the underlying silver circuit nor to the underlying circuits. The copper conductor is flexible and can move with respect to the chip except at the interconnection with the silver circuit. The copper conductors are preferably made circuitous as illustrated in FIG. 8 so that while the terminal portion of a conductor and the portion connected to the underlying circuit are physically quite close, a relatively long length of conductor is provided between the two points permitting considerable motion of the terminal and flexing of the copper conductor without stressing the copper conductor-silver circuit joint.

Although exemplary embodiments of the invention have been disclosed and discussed, it will be understood that other applications of the invention are possible and that the embodiments disclosed may be subjected to various changes, modifications and substitutions without necessarily departing from the spirit of the invention.

We claim as our invention:

1. In a circuit module, the combination of:

a circuit carrying chip having opposed faces with a plurality of terminals in a plane on one face only thereof and disposed wholly within the periphery of said chip;

a plurality of leads, with one end of each lead connected to a corresponding terminal at said one face; and an insulating housing overlying substantially the entire one face of said chip and fixed to said one face and enclosing and fixed to said leads adjacent the terminal ends thereof with the other ends of said leads projecting outwardly from said housing perpendicular to said one face for connecting said chip into an electrical circuit.

2. A circuit module as defined in claim 1 including an additional circuit element carried by and fixed to said housing, with the terminals of said element connected to particular ones of said leads.

3. In a circuit module, the combination of:

a circuit carrying chip having opposed faces with a plurality of terminals in a plane on one face only thereof and disposed wholly within the periphery of said chip;

a plurality of leads disposed with their terminal ends supstantially parallel with each other and perpendicular to said one face with said terminal ends abutting and fixed to corresponding chip terminals at said one face; and an insulating housing overlying substantially the entire one face of said chip and fixed to said one face and enclosing and fixed to said leads adjacent said terminal ends with the other ends of said leads projecting outwardly from said housing for connecting said chip into an electrical circuit.

4. A circuit module as defined in claim 3 in which said insulating housing includes a plurality of lead passages disposed substantially perpendicular to said chip face with said leads freely passing through corresponding passages, and means for sealing each of said leads in the respective passage.

5. In a circuit module, the combination of:

a circuit carrying chip having opposed faces with a plurality of terminals in a plane on one face only thereof and disposed wholly within the periphery of said chip;

a plurality of leads disposed along said chip face and fixed at the terminal ends thereof to corresponding chip terminals at said one face; and an insulating housing overlying said leads and substantially the entire one face of said chip and fixed to said one face and having grooves for receiving said leads adjacent said terminal ends with the other ends of said leads projecting outwardly from said housing perpendicular to said one face for connecting said chip into an electrical circuit.

6. In a circuit module, the combination of:

a circuit carrying chip having rows of terminals in a plane along opposite edges of one face only thereof and disposed wholly within the periphery of said chip;

a first plurality of leads disposed along said one chip face and fixed at the terminal ends thereof to corresponding chip terminals of one of said rows;

a second plurality of leads disposed along said one chip face and fixed at the terminal ends thereof to corresponding chip terminals of the other of said rows, with said leads of said first plurality bent normal to said one chip face adjacent said other row of terminals, and with said leads of said second plurality bent normal to said one chip face adjacent said one row of terminals; and an insulating housing overlying substantially the entire one face of said chip and fixed to said one chip face having grooves for receiving said leads along said one chip face and having two rows of passages normal to said one chip face with the bent portions of said leads disposed therein and with the other ends of said leads projecting outwardly from said housing perpendicular to said one face for connecting said chip into an electrical circuit.

7. In a circuit module, the combination of:

a circuit carrying chip having opposed faces with a plurality of terminals in a plane on one face only thereof and disposed wholly within the periphery of said chip;

a plurality of leads having flat terminal ends overlying and fixed to the corresponding chip terminals at said one face;

an insulating housing overlying substantially the entire one face of said chip and fixed to said terminal ends and chip face, with the other ends of said leads projecting beyond said housing for connecting said chip into an electrical circuit; and a circuit element carried on said housing and having terminals projecting through said housing and connected with selected ones of said terminal ends.

8. In a circuit module, the combination of:

a circuit carrying chip having opposed faces with a plurality of terminals in a plane on one face only thereof and disposed wholly within the periphery of said chips;

a plurality of leads, with one end of each lead connected to a corresponding terminal at said one face;

an insulating housing overlying substantially the entire one face of said chip and fixed to said one chip face, with the other ends of said leads projecting beyond said housing perpendicular to said one face for connecting said chip into an electrical circuit; and a circuit element carried between said chip and housing and electrically connected to selected leads.

9. In an electrical circuit unit, the combination of:

a substrate;

a first film conductor on said substrate;

an insulating layer on said substrate and first conductor and having an opening exposing at least a portion of said first conductor; and a second film conductor disposed over said insulating layer and joined only to said exposed portion of said first conductor at one zone of said second conductor, said second conductor having a terminal zone spaced from said one zone, said second conductor being of a flexible material providing movement of said terminal zone toward and away from said insulating layer.

10. In an electrical circuit unit, the combination of:

a substrate;

a first film conductor on said substrate;

an insulating layer on said substrate and first conductor and having on opening exposing at least a portion of said first conductor; and a second film conductor disposed over said insulating layer and joind only to said exposed portion of said first conductor at one zone of said second conductor, said second conductor having a terminal zone spaced from said one zone with said terminal zone adjacent said exposed portion and with said second conductor following a circuitous path therebetween, said second conductor being of a flexible material providing movement of said terminal zone toward and away from said insulating layer.

11. In a circuit module, the combination of:

a circuit carrying chip including a substrate, a film circuit on said substrate, an insulating layer on said substrate and circuit and having on opening exposing portions of said circuit, and a plurality of film conductors disposed over said insulating layer, with each of said conductors joined only to an exposed portion of said film circuit at one zone thereof and having a terminal zone spaced from said one zone, said conductors being of a flexible material providing movement of said terminal zones toward and away from said insulating layer;

a plurality of leads with one end of each lead connected to a terminal zone of a corresponding conductor; and an insulating housing overlying and fixed to said chip and enclosing and fixed to said leads adjacent the terminal ends thereof.

References Cited by the Examiner

UNITED STATES PATENTS

| | | | |
|---|---|---|---|
| 2,547,022 | 4/1951 | Leno | 339—17 |
| 2,721,822 | 10/1955 | Pritikin | 174—68.5 |
| 3,046,452 | 7/1962 | Gellert | 317—101 |
| 3,061,762 | 10/1962 | Schlegel | 174—52 X |
| 3,077,511 | 4/1963 | Bohrer et al. | 317—101 |
| 3,155,766 | 11/1964 | Eichert et al. | 174—52 |
| 3,164,750 | 1/1965 | Miller | 317—101 |
| 3,222,450 | 12/1965 | Lee et al. | 174—50.58 X |

ROBERT K. SCHAEFER, *Primary Examiner.*

KATHLEEN H. CLAFFY, *Examiner.*

M. GINSBURG, *Assistant Examiner.*